United States Patent
Morisson et al.

[11] Patent Number: 6,069,577
[45] Date of Patent: May 30, 2000

[54] A/D CONVERSION DEVICE PROVIDED WITH A GAIN CALIBRATION ARRANGEMENT

[75] Inventors: Richard Morisson, Caen; Philippe Gandy, Thaon; Frédéric Darthenay, St. Aubin/Mer, all of France

[73] Assignee: U.S. Philips Corporation, New York, N.Y.

[21] Appl. No.: 09/039,756

[22] Filed: Mar. 16, 1998

[30] Foreign Application Priority Data

Mar. 18, 1997 [FR] France ................................. 97 03291

[51] Int. Cl.$^7$ ................................................... H03M 1/10
[52] U.S. Cl. ............................................ 341/120; 341/155
[58] Field of Search ................................ 341/120, 156, 341/118, 155, 159, 144, 154

[56] References Cited

U.S. PATENT DOCUMENTS

| | | | |
|---|---|---|---|
| 5,313,207 | 5/1994 | Kouno et al. | 341/156 |
| 5,592,167 | 1/1997 | Caruso et al. | 341/159 |
| 5,696,508 | 12/1997 | Gross et al. | 341/118 |
| 5,805,096 | 9/1998 | Morisson et al. | 341/155 |
| 5,995,032 | 11/1999 | Gandy | 341/118 X |

OTHER PUBLICATIONS

"A CMOS 3V 24mW 20MSPS 10BIT A/D Converter with Self Calibration Unit", by Kumazawa et al., in 1994 Symposium on VLSI Circuits, Digest of Technical papers. pp. 15,16.

Primary Examiner—Brian Young
Assistant Examiner—Patrick Wamsley
Attorney, Agent, or Firm—Steven R. Biren

[57] ABSTRACT

An A/D conversion device includes:
  an amplifier AMP receiving an input voltage V1 and supplying an output voltage V2, and
  an A/D converter ADC2 intended to convert the output voltage V2 of the amplifier AMP into a digital signal by comparing it with reference voltages generated by a resistance ladder R2 traversed by a bias current.

The device includes a multiplexer MUX for setting the input of the amplifier AMP at a reference potential when a calibration signal CALG is active, and a calibration arrangement DECM which compares the output of the second converter ADC2 with a predetermined binary word, supplies a control signal GC, which depends on the result of said comparison and determines the value of the bias current, and stores the control signal GC when the calibration signal CALG is inactive.

5 Claims, 2 Drawing Sheets

A/D CONVERSION DEVICE PROVIDED WITH A GAIN CALIBRATION ARRANGEMENT

BACKGROUND OF THE INVENTION

The invention relates to an A/D conversion device having an input intended to receive an analog input signal, and an output intended to supply a digital output signal, comprising:

an amplifier having an input intended to receive the analog input signal of the device, and an output, an A/D converter having an analog input connected to the output of the amplifier and an output intended to supply the digital output signal of the device, comprising a resistance ladder traversed by a current supplied by a controllable bias current source, the junction points between said resistances supplying a plurality of reference voltages intended to be compared with the signal received at the input of the converter, the results of these comparisons being used to elaborate the digital output signal of the device.

Such a device is described in U.S. Pat. No. 5,313,207. This device is used within an A/D conversion circuit having a two-step structure in which a primitive analog signal is converted into a digital signal by a first A/D converter which supplies, at the output, a digital signal referred to as most significant word which constitutes an approximation of the digital value of the analog input signal and thus forms the most significant part of the digital output signal of the conversion circuit. The most significant word is converted into an analog signal by a D/A converter which supplies, at the output, a signal referred to as converted signal which corresponds to the transposition to an analog value of the approximate digital value supplied by the first A/D converter. Here, this converted signal takes the form of a current which acts on a device as described in the opening paragraph, in which the amplifier receives the primitive analog signal at the input. In this device, the control signal is actually constituted by the most significant word, the operation consisting of adjusting the value of the output voltage of the amplifier via the regulating means incorporating the analog conversion of said word. The amplifier thus supplies, at the output, an analog signal referred to as residual signal which is representative of a quantization error due to the approximation effected by the first A/D converter, which residual signal is converted within the device by a second A/D converter into a digital signal referred to as least significant word which thus forms the least significant part of the digital output signal of the conversion circuit. The gain of the amplifier must be such that to the maximum excursion of its input voltage corresponds the maximum value of the least significant word. If the amplifier has a gain which is too high, the second A/D converter tends to come in a saturation mode, i.e. it supplies the same output signal for all the input signals having a value which exceeds a given threshold it receives. If the gain value is too low, certain values which are available at the output of the second A/D converter will never be reached by the least significant word. These phenomena may cause discontinuities in the development of the value of the output signal of the device as a function of the development of the value of the primitive analog signal, which is not acceptable.

SUMMARY OF THE INVENTION

It is an object of the invention to remedy this drawback by providing an A/D conversion device in which the maximum excursion of the output signal of the A/D converter is fitted to the maximum excursion of the input voltage of the preceding amplifier by means of a control loop.

To this end, an A/D conversion device according to the invention is characterized in that it has an input intended to receive a calibration signal, and in that it comprises means for setting the input of the amplifier at a predetermined reference potential when the calibration signal is active, and a calibration arrangement comprising:

a comparison module, activated when the calibration signal is active, comprising a comparator intended to supply, at an output, a signal which is representative of at least one comparison between the digital output signal and a predetermined binary word, a control module having an input connected to the output of the comparison module and being activated when the calibration signal is active, intended to supply a digital control signal, whose value depends on the value of a signal received at the input of the control module, and intended to effect a variation of the value of the current supplied by the bias source, and storage means in which the value of the control signal is stored when the calibration signal is inactive.

When such a device operates in the calibration mode, i.e. when the calibration signal is active, it enables a potential of known value to be imposed on the input of the amplifier. The value of the predetermined binary word arbitrarily corresponds to the value which the digital output signal of the device must assume when, in the normal operating mode, the input of the amplifier receives the voltage whose value is equal to that of the reference potential. In the calibration mode, any difference existing between the digital output signal of the device and the predetermined binary word is detected by the comparison module and compensated by means of the control signal elaborated by the control module as a function of the result of the comparison carried out within the comparison module, said control signal acting on the value of the current flowing through the resistance ladder which supplies the reference voltages used by the A/D converter.

A variant of the invention is characterized in that the bias current source comprises N current sources which are parallel arranged between the second power supply terminal and one end of the resistance ladder, the value $I_i$ of the nominal current supplied by the current source of row i (for i=1 to N) being equal to $I0/2^{(i-1)}$ in which I0 is a predetermined value, the control signal is a binary word of N+1 bits, each of which, when being in an active state, controls the conduction of one of the N current sources constituting the bias current source.

The control module may thus elaborate the optimum value of the control signal by way of successive approximations, notably by applying a dichotomy method. An embodiment of this variant of the invention is thus characterized in that the calibration signal being active during at least N times a comparison cycle, in the course of which an analog signal at the output of the amplifier is converted into a digital signal and then compared with the predetermined binary word, the comparison module is provided with a register intended to store, in the course of a control cycle whose duration is at least equal to that of a comparison cycle, the value taken by the output signal of the comparator in the course of at least one of the previous control cycles, the control module is provided with means for systematically placing, in the course of the first control cycle, the bit of rank 1 of the control signal at the active state, the control module is provided with means for systematically placing at the active state, in the course of any subsequent control cycle, the bit of the rank subsequent to that of the previous bit whose state has been modified in the course of the previous cycle, the previous bit being unchanged if the value of the signal which it receives at its input is identical to that of the signal received at the end of the previous control cycle, and inversed in the opposite case, the process being repeated until the DC level calibration signal resumes the inactive state.

In a preferred embodiment of the invention, an A/D conversion device as described above is characterized in that the calibration signal being active during at least N.P comparison cycles, each control cycle comprises P comparison cycles, the comparison module is provided with a register intended to store the values taken by the output signal of the comparator at the end of each one of the P successive comparisons carried out in the course of a same control cycle, and with a weighting module intended to supply, at an output, a signal whose value is representative of an average of said values, said output constituting the output of the comparison module.

The weighting of the results of P successive comparisons enables to avoid oscillations due to untimely corrections. Indeed, the output of the comparison module including a weighting module is representative of a tendency materialized by at least P/2 comparison results. This weighting thus allows a limitation of the effects which would be produced by an accidental difference between the digital output signal of the device and the predetermined binary word, which would be due to, for example, an erroneous conversion.

As stated hereinbefore, such an A/D conversion device may be used advantageously within an A/D conversion circuit having a two-step structure. The invention thus also relates to an A/D conversion circuit having an input intended to receive an analog input signal, and an output intended to supply a digital output signal, comprising:

a first A/D conversion device having an input and an output respectively intended to receive, the analog input signal of the circuit and to supply a signal of a digital kind, referred to as most significant word, constituting the most significant part of the digital output signal of the circuit, a D/A converter intended to receive the most significant word and to convert it into an output signal of an analog kind, referred to as converted signal, a second A/D conversion device having an analog input intended to receive the difference between the converted signal and the input signal of the circuit, and an output intended to supply a signal of a digital kind, referred to as least significant word, constituting the least significant part of the digital output signal of the circuit, said conversion circuit being characterized in that at least one of the two A/D conversion devices is in accordance with any one of the embodiments described hereinbefore.

These and other aspects of the invention are apparent from and will be elucidated with reference to the embodiments described hereinafter.

DESCRIPTION OF THE PREFERRED EMBODIMENTS

Figure 1:
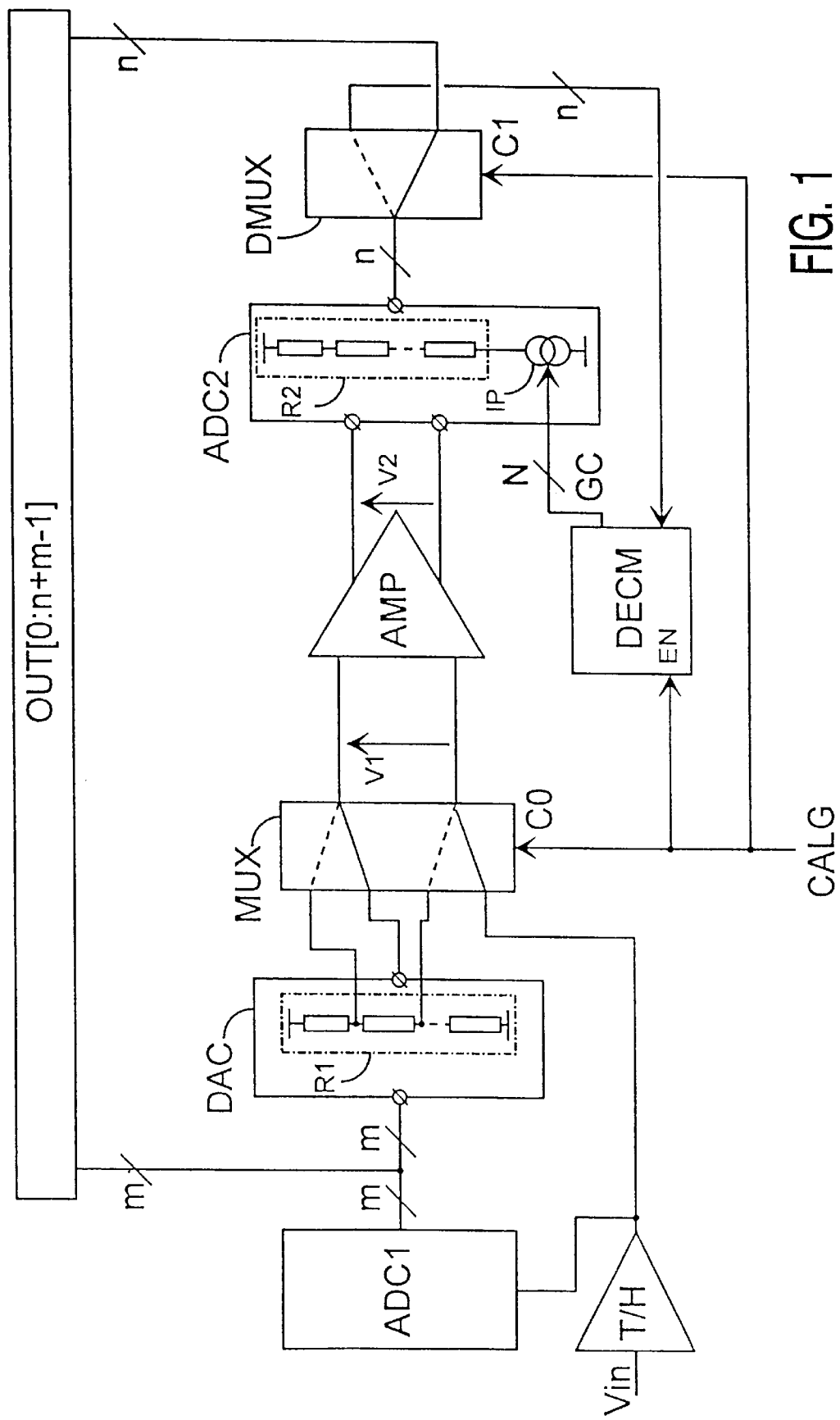
FIG. 1 is a circuit diagram of a two-step A/D conversion circuit in which the invention is used.

FIG. 1 shows diagrammatically a two-step A/D conversion circuit in which the invention is used. This circuit has an input intended to receive an analog input signal Vin via a track-and-hold circuit T/H in this example, and an output intended to supply a digital output signal OUT[0:n+m−1], and comprises:

a first A/D converter ADC1 having an input and an output respectively intended to receive, the analog input signal Vin of the circuit, and to supply a signal OUT[n:m−1] of a digital kind, referred to as most significant word, constituting the most significant part of the digital output signal OUT[0:n+m−1] of the circuit, a D/A converter DAC intended to receive the most significant word OUT[n:m−1], and to convert it into an output signal of an analog kind, referred to as converted signal, an A/D conversion device having an analog input intended to receive a voltage V1, referred to as residual signal, which represents the difference between the converted signal and the input signal Vin of the circuit, and an output intended to supply a signal OUT[0:n−1] of a digital kind, referred to as least significant word, constituting the least significant part of the digital output signal OUT[0:n+m−1] of the circuit.

This conversion device comprises:

an amplifier AMP having an output supplying a voltage V2 and a differential input intended to receive the residual signal V1, a second A/D converter ADC2 having an analog input connected to the output of the amplifier AMP and thus receiving the voltage V2, and an output intended to supply the digital output signal of the device, which signal constitutes the least significant word OUT[0:n−1] and which comprises a resistance ladder R2 traversed by a current IP supplied by a controllable bias current source, the junction points between said resistances supplying a plurality of reference voltages intended to be compared with the voltage V2 received at the input of the converter ADC2, the results of these comparisons being used to elaborate the digital output signal OUT[0:n−1] of the device.

The conversion device also has an input intended to receive a calibration signal CALG. It comprises a multiplexer MUX for setting the input of the amplifier AMP at a reference potential when the gain calibration signal CALG is active. In this example, the D/A converter DAC performs the conversion on the basis of reference voltages elaborated by means of a resistance ladder R1 having identical nominal values and arranged in series between two power supply terminals. This resistance ladder R1 is advantageously chosen as being the same as that used within the first A/D converter ADC1. The value of the voltage at the terminals of one of the resistors, which corresponds to the analog value of the least significant bit of the most significant word OUT[n:m-1] determines the maximum quantization error made by the first A/D converter ADC1 and thus the maximum value of the residual signal V1. The reference potential used for the gain calibration of said amplifier must thus be equal to this maximum value.

The device also comprises a calibration device DECM which receives the least significant word OUT[0:n-1] via a demultiplexer DMUX when the calibration signal CALG is active, and compares this word with a predetermined binary word whose value, in this example, is the maximum value which can be assumed by the output of the second A/D converter ADC2.

A calibration arrangement DECM allows a variation of the value of the current IP supplied by the bias source. This allows adjustment of the values of the reference voltages generated by the resistance ladder R2 within the second A/D converter ADC2 and thus particularly adjustment of the largest value of these voltages in order that it corresponds to the maximum value which can be assumed by the residual signal V1. The bias source must always be conducting because it biases the resistance ladder R2, the reference voltages thus generated being indispensable for the operation of the device. The value of the current IP supplied by the bias source develops in the following way: when the value of the least significant word OUT[0:n-1] is lower than the maximum value which can be assumed by the output of the second A/D converter ADC2, this means that the values of the reference voltages used by said converter are too high, which must be compensated by a decrease of the value of the current IP supplied by the bias source. If the value of the least significant word OUT[0:n-1] is equal to the maximum value which may be assumed by the output of the second A/D converter ADC2, this may mean that the values of the reference voltages are too low and that the second A/D converter ADC2 is in a saturation mode, i.e. it supplies the same output signal for all the input signals having a value which exceeds a given threshold it receives. The values of the reference voltages are thus increased by means of the control signal CALG which then effects an increase of the value of the current IP supplied by the bias source. If, after this correction, the value of the least significant word OUT[0:n-1] of the device appears to be still equal to the maximum value which may be assumed by the output of the second A/D converter ADC2, this indeeds means that the values of the reference voltages are too low and that the second A/D converter is in the saturation mode. The current supplied by the bias source must thus be increased again. The balance searched is signalized by a change of the comparison result described above. When this change occurs, the previous regulation of the value of the control signal CALG, previously stored in a register, is validated and will be used in the normal operating mode of the device.

Figure 2:
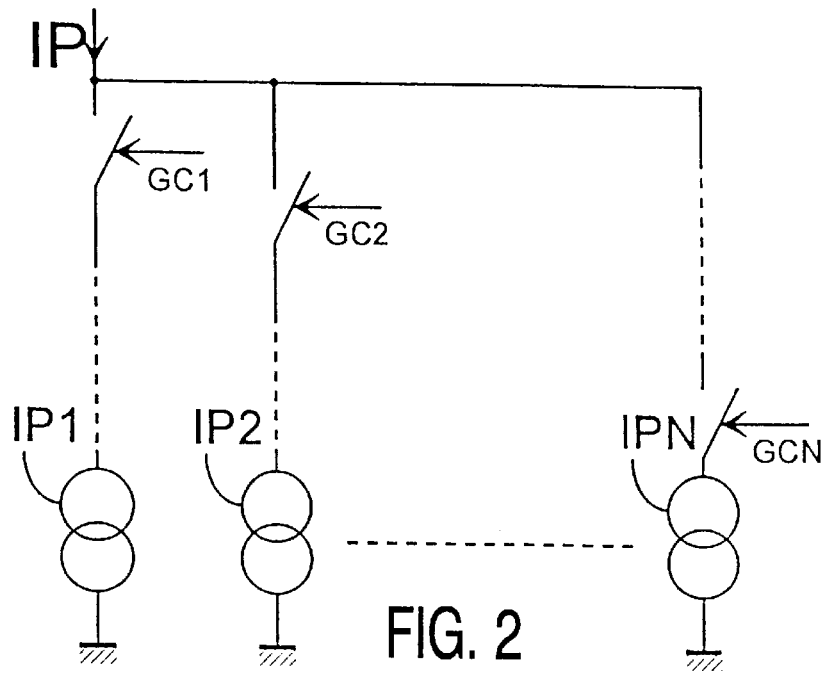
FIG. 2 is an electric circuit diagram of a current source included in such an amplifier.

FIG. 2 shows diagrammatically an embodiment of the bias source and the device used for regulating the value of the current IP supplied thereby. This source comprises N current sources arranged in parallel between ground of the circuit and a node, which is common for all the sources and intended to be traversed by the current IP. The value $IP_i$ of the nominal current supplied by the current source of the rank i (for i=1 to N) is equal to $I0/2^{(i-1)}$ in which I0 is a predetermined value. In conformity with the previous statement, the control signal GC is a binary word of N bits, of which each bit GCi, for i=1 to N, controls, in the active state, the conduction of one of the N current sources $IP_i$, for i=1 to N, constituting the bias source. At any moment, at least one of the bits of the control signal GC is in the active state in order to maintain the conduction of the bias source.

Figure 3:
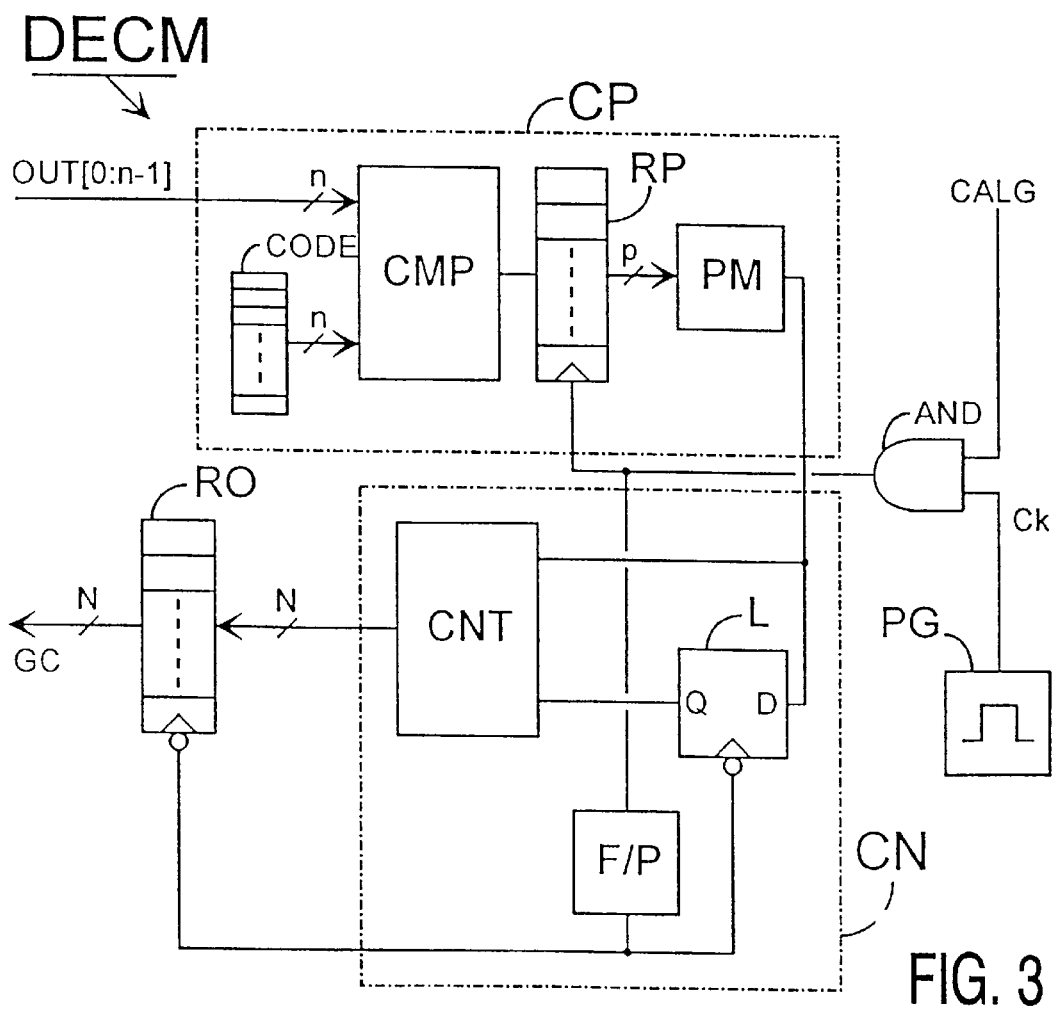
FIG. 3 is a circuit diagram of a calibration arrangement which is present in a variant of the invention.

FIG. 3 shows diagrammatically the calibration arrangement DECM which is present in a variant of the invention. This arrangement comprises:
  a comparison module CP comprising a comparator CMP intended to supply, at an output, a signal which is representative of at least one comparison between the digital output signal OUT[0:n-1] of the second converter ADC2 and a predetermined binary word which is stored in a register CODE and whose value is equal to the maximum which may be assumed by the output of the second A/D converter ADC2,
  a control module CN having an input connected to the output of the comparison module, intended to supply the control signal GC, whose elaboration will be described hereinafter, and
  a register R0 in which the value of the control signal GC is stored when the conversion device is in its normal operating mode.

The calibration arrangement DECM receives the calibration signal CALG which is active during at least N times a duration referred to as comparison cycle, in the course of which the output voltage V2 of the amplifier AMP is converted into a digital signal by the second A/D converter ADC2 and then compared with the binary word stored in the register CODE. The comparison module CP is provided with a register RP intended to store, in the course of a control cycle whose duration is at least equal to that of a comparison cycle, the value taken by the output signal of the comparator CMP in the course of at least one of the previous control cycles.

In the variant of the invention described here, the calibration signal CALG is active during at least N.P comparison cycles, and each control cycle comprises P comparison cycles. The register RP of the comparison module CP is rhythmed by a clock signal Ck supplied by a pulse generator PG and enabled by the DC level calibration signal CALG by means of a logic AND gate AND. This register RP is intended to store the values taken by the output signal of the comparator CMP at the end of each one of the P successive comparisons carried out in the course a the same control cycle. The comparison module CP is also provided with a weighting module PM intended to supply, at an output, a signal whose value is representative of an average of said values, said output constituting the output of the comparison module CP. The output signal of the comparison module CP is thus representative of a tendency materialized by at least P/2 identical comparison results, which enables to avoid oscillations resulting from inadvertent corrections caused by accidental differences between the digital output signal OUT[0:n-1] of the second A/D converter ADC2 which would be due to, for example, an erroneous conversion. The control module CN comprises a latch L intended to store, in the course of a control cycle, the value of the output signal from the comparison module CMP at the end of the previous cycle. Since a control cycle lasts P comparison cycles, this latch L is rhythmed by a signal delivered by a frequency divider F/P whose input receives the clock signal Ck and supplies a signal whose frequency is P times lower. Since the conduction of the current source is subjected to the control signal GC, a calibration cycle must imperatively occur as from the moment the device is switched on. In the course of the first control cycle of this first calibration cycle, in which all reference voltages are zero, the output of the comparison module CP signalizes that an increase of the current IP supplied by the bias source is necessary. The control module CN places, in the course of the first control cycle, the bit GC1 of rank 1 of the control signal GC at the active state.

In the course of any subsequent control cycle, the control module CN systematically places at the active state the bit of the rank subsequent to that of the previous bit whose state has been modified in the course of the previous cycle, the previous bit being unchanged if the value of the signal supplied by the comparison module CP is identical to that of the signal supplied at the end of the previous control cycle, and inversed in the opposite case. This process is repeated until the calibration signal CALG resumes the inactive state, thus causing the control signal GC to be stored in the register R0.

What is claimed is:

1. An A/D conversion device having an input intended to receive an analog input signal, and an output intended to supply a digital output signal, comprising:

an amplifier having an input intended to receive the analog input signal of the device, and an output, an A/D converter having an analog input connected to the output of the amplifier and an output intended to supply the digital output signal of the device, comprising a resistance ladder traversed by a current supplied by a controllable bias current source, the junction points in said ladder supplying a plurality of reference voltages intended to be compared with the signal received at the input of the converter, the results of these comparisons being used to generate the digital output signal of the device, said conversion device being characterized in that it has an input intended to receive a calibration signal, and in that it comprises means for setting the input of the amplifier at a predetermined reference potential when the calibration signal is active, and a calibration arrangement comprising:

a comparison module, activated when the calibration signal is active, comprising a comparator intended to supply, at an output, a signal which is representative of at least one comparison between the digital output signal and a predetermined binary word, a control module having an input connected to the output of the comparison module and being activated when the calibration signal is active, intended to supply a digital control signal, whose value depends on the value of a signal received at the input of the control module, and intended to effect a variation of the value of the current supplied by the bias current source, and storage means in which the value of the control signal is stored when the calibration signal is inactive.

2. An A/D conversion device as claimed in claim 1, characterized in that the bias current source comprises N current sources which are arranged in parallel between the second power supply terminal and one end of the resistance ladder, the value $I_i$ of the nominal current supplied by the current source of row i (for i=1 to N) being equal to $I0/2^{(i-1)}$ in which I0 is a predetermined value, the control signal is a binary word of N+1 bits, each of which, when being in an active state, controls the conduction of one of the N current sources constituting the bias current source.

3. An A/D conversion device as claimed in claim 2, characterized in that the calibration signal being active during at least N times a comparison cycle, in the course of which an analog signal at the output of the amplifier is converted into a digital signal and then compared with the predetermined binary word, the comparison module is provided with a register intended to store, in the course of a control cycle whose duration is at least equal to that of a comparison cycle, the value taken by the output signal of the comparator in the course of at least one of the previous control cycles, the control module is provided with means for systematically placing, in the course of the first control cycle, the bit of rank 1 of the control signal at the active state, the control module is provided with means for systematically placing at the active state, in the course of any subsequent control cycle, the bit of the rank subsequent to that of the previous bit whose state has been modified in the course of the previous cycle, the previous bit being unchanged if the value of the signal which it receives at its input is identical to that of the signal received at the end of the previous control cycle, and inverted in the opposite case, the process being repeated until the DC level calibration signal resumes the inactive state.

4. An A/D conversion device as claimed in claim 3, characterized in that the calibration signal being active during at least N.P comparison cycles, each control cycle comprises P comparison cycles, the comparison module is provided with a register intended to store the values taken by the output signal of the comparator at the end of each one of the P successive comparisons carried out in the course of a same control cycle, and with a weighting module intended to supply, at an output, a signal whose value is representative of an average of said values, said output constituting the output of the comparison module.

5. An A/D conversion circuit having an input intended to receive an analog input signal, and an output intended to supply a digital output signal, comprising:

a first A/D conversion device having an input and an output respectively intended to receive the analog input signal of the circuit and to supply a signal of a digital kind, referred to as most significant word, constituting the most significant part of the digital output signal of the circuit, a D/A converter intended to receive the most significant word and to convert it into an output signal of an analog kind, referred to as converted signal, a second A/D conversion device having an analog input intended to receive the difference between the converted signal and the input signal of the circuit, and an output intended to supply a signal of a digital kind, referred to as least significant word, constituting the least significant part of the digital output signal of the circuit, said conversion circuit being characterized in that at least one of the two A/D conversion devices is in accordance with claim 1.

* * * * *